US008964475B2

(12) United States Patent
Lee

(10) Patent No.: US 8,964,475 B2
(45) Date of Patent: Feb. 24, 2015

(54) MEMORY CELL STRING BASED ON GATED-DIODE CELL AND MEMORY ARRAY USING THE SAME

(71) Applicant: Seoul National University R&DB Foundation, Seoul (KR)

(72) Inventor: Jong-Ho Lee, Seoul (KR)

(73) Assignee: Seoul National University R&DB Foundation (KR)

( * ) Notice: Subject to any disclaimer, the term of this patent is extended or adjusted under 35 U.S.C. 154(b) by 0 days.

(21) Appl. No.: 13/912,578

(22) Filed: Jun. 7, 2013

(65) Prior Publication Data

US 2013/0329499 A1 Dec. 12, 2013

(30) Foreign Application Priority Data

Jun. 9, 2012 (KR) .................. 10-2012-0061848

(51) Int. Cl.
G11C 11/34 (2006.01)
H01L 27/115 (2006.01)
G11C 16/04 (2006.01)
H01L 27/102 (2006.01)
H01L 29/861 (2006.01)
H01L 29/78 (2006.01)
H01L 29/792 (2006.01)

(52) U.S. Cl.
CPC ...... H01L 27/11563 (2013.01); G11C 16/0408 (2013.01); H01L 27/1021 (2013.01); H01L 29/8613 (2013.01); H01L 29/8615 (2013.01); H01L 27/1157 (2013.01); H01L 29/8616 (2013.01); H01L 29/785 (2013.01); H01L 29/792 (2013.01)

USPC ............ 365/185.17; 365/185.05; 365/185.13; 365/185.16; 365/185.18; 365/185.27

(58) Field of Classification Search
CPC ...................................... G11C 16/04
USPC ............. 365/185.17, 185.05, 185.13, 185.16, 365/185.18, 185.27
See application file for complete search history.

(56) References Cited

U.S. PATENT DOCUMENTS 5,191,551 A * 3/1993 Inoue ................. 365/185.17
5,923,587 A * 7/1999 Choi .................. 365/185.11
5,973,356 A * 10/1999 Noble et al. ............. 257/319
(Continued)

FOREIGN PATENT DOCUMENTS

KR 100745766 7/2007

OTHER PUBLICATIONS

Lee et al., "NAND flash memory technology utilizing fringing electric field", Microelectronics Reliability, vol. 52, pp. 662-669 (2012), available online Nov. 3, 2011.*

Primary Examiner — Fernando Hidalgo
(74) Attorney, Agent, or Firm — Cantor Colburn LLP

(57) ABSTRACT

The present invention provides a nonvolatile memory cell string and a memory array using the same. According to the present invention, a wall type semiconductor separated into twin fins and a memory cell string formed with memory cells having a gated diode structure along each fin are enabled to increase the degree of integration and basically prevent the interferences between adjacent cells. And a first semiconductor layer and a depletion region of a PN junction wrapped up by a gate electrode are enabled to remove GSL and CSL by GIDL memory operation and significantly increase the degree of integration for applying to a neuromorphic technology.

21 Claims, 9 Drawing Sheets

(56) References Cited

U.S. PATENT DOCUMENTS

| | | |
|---|---|---|
| 7,825,455 B2 | 11/2010 | Lee et al. |
| 2002/0028541 A1* | 3/2002 | Lee et al. ........................ 438/149 |
| 2006/0044872 A1* | 3/2006 | Nazarian .................. 365/185.17 |
| 2006/0181925 A1* | 8/2006 | Specht et al. ............ 365/185.17 |
| 2007/0183204 A1* | 8/2007 | Kim et al. ................ 365/185.17 |
| 2007/0296033 A1* | 12/2007 | Park et al. ...................... 257/347 |
| 2008/0266949 A1* | 10/2008 | He et al. .................... 365/185.05 |
| 2008/0285327 A1* | 11/2008 | Ogiwara et al. ............... 365/145 |
| 2009/0010064 A1* | 1/2009 | Nazarian .................. 365/185.17 |
| 2009/0109750 A1* | 4/2009 | Widjaja .................... 365/185.03 |
| 2009/0173985 A1* | 7/2009 | Lee et al. ....................... 257/315 |
| 2009/0184362 A1* | 7/2009 | Lee ................................ 257/324 |
| 2011/0147806 A1* | 6/2011 | Wilson et al. .................. 257/261 |
| 2011/0249503 A1* | 10/2011 | Yamada et al. .......... 365/185.19 |
| 2012/0051137 A1* | 3/2012 | Hung et al. ............... 365/185.17 |
| 2012/0058619 A1* | 3/2012 | Park et al. ...................... 438/301 |

\* cited by examiner

MEMORY CELL STRING BASED ON GATED-DIODE CELL AND MEMORY ARRAY USING THE SAME

CROSS-REFERENCE TO RELATED APPLICATION

This application claims priority under 35 U.S.C. 119 of Korean Patent Application No. 10-2012-0061848 filed on Jun. 9, 2012, the entire contents of which are hereby incorporated by reference.

BACKGROUND OF INVENTION

1. Field of the Invention

The present invention relates to a nonvolatile memory cell string and a NAND flash memory array using the same. Additionally, the present invention also relates to neuromorphic technologies mimicking a synapse, a synapse array and functions of neurons and synapses.

2. Description of the Related Art

To increase the degree of integration in a NAND flash memory etc., memory cell devices and structures of memory cell strings thereof connected in series have been continuously studied.

In the recently spotlighted technologies mimicking the functions of neurons and synapses, high integrated memories and strings and arrays connected with the memories are increasingly needed. The functions of synapses can be mimicked by the memory devices, but it is needed to have some excellent characteristics such as reliability, low power, low noise and reproducibility etc. Especially, when human brain is mimicked, it is needed to highly increase the degree of integration because about $10^{14}$ synapses have to be embodied by the memory cells.

FinFET has been developed to overcome the problems of conventional plane-type devices such as a short channel effect (SCE), a low read current due to the leakage currents and a drain induced barrier lowering (DIBL) etc.

Though the FinFET structure can solve the problems of the above mentioned plane structure, it is always have another problem associated with a high integration because of a limitation in reducing width of a fin needed in one cell and that of oxide/nitride/oxide (ONO) layers formed on the both sides of the fin.

To solve the problem of the conventional FinFET structure, Korean Patent No. 10-0745766 (refer to patent reference 1) provides techniques for increasing the degree of integration by reducing the fin separation distance between adjacent cells through isolating two fin structures with a buried insulating layer and simply wrapping the two fins with a gate electrode interlaying a gate insulating layer.

By the way, the patent reference 1 shows that the isolated two fin structures interlaying a buried insulating layer forms adjacent cell strings and each cell string contains a plurality of cell devices and at least two switch devices. The FET based cell devices oppositely formed to each other interlaying the buried insulating layer have a problem changing threshold voltage of devices due to the interference to each other. Two adjacent cell strings isolated by the buried insulting layer need a cell string contact pad having 3 times wider width than that of the conventional cell string and a common source line (CSL) contact pad on both end sides, respectively and it causes an loss of area. Especially, formation of the pads for contacting to metal interlaying the buried insulating layer with a narrow width causes a design rule matter and so it needs to consume more area.

And the conventional NAND flash memory array, as shown in FIG. 10, necessarily has a string selection line (SSL) for selecting cell string and a common source line (CSL) and a ground selection line (GSL) for selecting CSL on both sides of each memory string.

By the way, because SSL and GSL are conventionally formed to have a line width 4~5 times more than that of each word line (it means that selection transistors selected by SSL and GSL are formed with an area 4~5 times more than that of memory device formed by each word line), the area loss is one of reasons preventing a high integration.

The above mentioned problem takes place by reading a current flowing between a bit line connected to a specific cell string and CSL after being always turned on the selection transistors by SSL and GSL on reading any cell in the specific cell string of the conventional NAND flash memory.

SUMMARY OF THE INVENTION

The present invention is directed to provide a memory cell string having a gated diode structure for significantly increasing the degree of integration and memory arrays using the same by embodying the memory cell string with memory cells having a gated diode structure for basically changing a reading method of any cell in a specific cell string of the conventional NAND flash memory and removing GSL and CSL necessarily needed in the conventional cell strings and NAND flash memory arrays. Additionally, the memory cell structures, cell strings and cell arrays are to be used in a neuromorphic technology.

To achieve the objectives, a nonvolatile memory cell string according to the present invention comprising: two or more cell devices formed in series on a wall type semiconductor protruded from a semiconductor substrate with a predetermined length along one direction to form the cell string, wherein one end of the cell string is electrically connected to outside through one or more string selection transistors formed on one end of the wall type semiconductor, wherein the other end of the cell string is not electrically connected to outside, wherein each of the cell devices is formed on a first semiconductor layer doped with a specific type of impurity on an upper part of the wall type semiconductor and a second semiconductor layer doped with a type of impurity opposite to the first semiconductor layer for forming a PN junction at a lower part of the first semiconductor layer, wherein a gate insulating layer stack containing a charge storage of each of the cell devices is formed on a part of the wall type semiconductor, and wherein a gate electrode of each of the cell devices is formed on the gate insulating layer stack in transverse direction of the wall type semiconductor.

The string selection transistors are consisted of gate electrodes connected to string selection lines, sources, drains and bodies. The first semiconductor layer can be a source or a drain. The body of string selection transistor can be doped with an impurity which is the same type as the second semiconductor layer and electrically connected to the second semiconductor layer. But the body of string selection transistor can be electrically isolated from the second semiconductor layer by forming a well doped with a type of impurity opposite to the body and forming the cell device in the well.

Here, the wall type semiconductor can be formed with twin fins separated by a trench formed in a longitudinal direction with a predetermined depth from an upper part, and the twin fins can form two independent cell strings having the first and second semiconductor layers from the upper part respectively.

The twin fins can be separated by a separation insulating layer filled up the inside of the trench, and the separation insulating layer can be formed to protrude more than the twin fins. As another embodiment, insulating layers can be formed on the surface of the trench separating the twin fins and a shielding electrode is filled between the insulating layers.

And the impurity doping concentration of adjacent surfaces of the second semiconductor layer formed on lower part of the bottom of trench which is formed between the twin fins can be higher than that of other regions of the second semiconductor layer.

The shielding electrode can be electrically connected to the wall type semiconductor being in one body with the semiconductor substrate and formed of a semiconductor material doped with the same type impurity as the wall type semiconductor or a conductive material.

A gate electrode of each of the cell devices can be formed in transverse direction of the wall type semiconductor to wrap the first semiconductor layer and the PN junction interlaying a gate insulating layer stack containing a charge storage layer. In this case, the first semiconductor layer can be formed to be rounded at a corner of upper and side parts of the first semiconductor layer. An isolation insulating layer can be further formed around the wall type semiconductor, and a part of the wall type semiconductor can be protruded from the isolation insulating layer The gate insulating layer stack can be sequentially formed with a tunneling insulating layer/the charge storage layer/a blocking insulating layer or the charge storage layer/a blocking insulating layer when the charge storage layer is simply consisted of an insulating layer.

The charge storage layer can be consisted of two or more layers formed with materials having a different dielectric constant (e.g., a first charge storage layer and a second charge storage layer etc.) for enabling to embody a short-term memory and a long-term memory.

At this time, the gate insulating layer stack can be only formed by sequentially stacking a tunneling insulating layer/the charge storage layer/a blocking insulating layer on the side wall of the wall type semiconductor.

And the wall type semiconductor can be further comprising a third semiconductor layer doped with the same type impurity as the first semiconductor layer for forming a PN junction with the second semiconductor layer at a lower part of the second semiconductor layer.

The third semiconductor layer can be extended to the semiconductor substrate and electrically connected to adjacent wall semiconductors.

And a fourth semiconductor layer can be further formed on the upper part of first semiconductor layer, and the fourth semiconductor layer can be doped with the same type impurity as the first semiconductor layer and have an energy bandgap smaller than that of the first semiconductor layer.

A NAND flash memory array according to the present invention comprising: a plurality of cell strings formed to have a predetermined length along one direction on a semiconductor substrate; a plurality of word lines formed to intersect each of the cell strings; a plurality of bit lines electrically connected to one end of each of the cell strings; and one or more string selection lines to select each of the cell strings, wherein each of the cell strings is formed on a wall type semiconductor protruded from the semiconductor substrate, wherein the string selection line is formed to intersect the wall type semiconductor at least by one side of the plurality of word lines, wherein each of the bit lines is electrically connected to one end of each of the cell strings exposed to one side of the string selection line, wherein the other end of each of the cell strings is not electrically connected to outside, and wherein each of cell devices forming each of the cell strings is formed on a first semiconductor layer doped with a specific type of impurity on an upper part of the wall type semiconductor and a second semiconductor layer doped with a type of impurity opposite to the first semiconductor layer for forming a PN junction at a lower part of the first semiconductor layer.

Here, the wall type semiconductor can be protruded with a predetermined interval on the semiconductor substrate and formed with twin fins separated by a trench formed in a longitudinal direction with a predetermined depth from an upper part, and a shielding line can be further formed on inner side interlaying an insulating layer between the twin fins for forming a shielding electrode in each of the cell devices. The shielding line can be electrically connected to the semiconductor substrate or apply a specific voltage independently from the semiconductor substrate.

The string selection line (SSL) can be formed into a single line by one side of the plurality of word lines or two lines in both sides of the plurality of word lines. In the latter, each of the bit lines is connected to one end of each of the cell strings exposed to one side of each string selection line by alternating with the each string selection line.

A nonvolatile memory cell string and a memory array using the same according to the present invention can be operated under the lower power than the conventional one by reading the current flowing between a bit line and a common body positively using a gate induced drain leakage (GIDL) known as a leakage current in the conventional switching devices instead of reading the current flowing between a bit line and a common source line (CSL) as like as the conventional read method and also significantly increase the degree of integration by removing GSL and CSL structures as a cause of the loss of area needed in the conventional cell strings and NAND flash memory arrays.

A nonvolatile memory cell string and a memory array using the same according to the present invention can be applied to embody synapses and synapse arrays in a neuromorphic technology.

Cell devices embodied by a nonvolatile memory cell string and a memory array using the same according to the present invention are memory cells having a gated diode not the conventional FinFET structure and can increase the degree of integration by separating a wall type semiconductor into two twin fins. And also the interference of adjacent cells can be basically prevented when a shielding electrode is used to separate.

In these drawings, the following reference numbers are used throughout: reference number 1 indicates a semiconductor substrate, 10, 91 and 92 a wall type semiconductor, 11 a depletion region, 12, 12', 14 and 14' a twin fin or a second semiconductor layer, 22 and 24 a first semiconductor layer, 30 a separation insulating layer, 32 a shielding line, 40 an isolation insulating layer, 50 a gate insulating layer stack, 60 a gate electrode or a word line, 62 a string selection line, and 72, 72a, 74a, 76, 76a, 78a, 84 and 88 a bit line.

DETAILED DESCRIPTION

Detailed descriptions of preferred embodiments of the present invention are provided below with accompanying drawings.

Embodiment for Nonvolatile Memory Cell String

A nonvolatile memory cell string according to an embodiment of the present invention comprising: two or more cell devices formed in series on a wall type semiconductor protruded from a semiconductor substrate with a predetermined length along one direction to form the cell string, wherein one end of the cell string is electrically connected to outside through one or more string selection transistors formed on one end of the wall type semiconductor, wherein the other end of the cell string is not electrically connected to outside, wherein each of the cell devices is formed to have a gated diode structure on a first semiconductor layer doped with a specific type of impurity on an upper part of the wall type semiconductor and a second semiconductor layer doped with a type of impurity opposite to the first semiconductor layer for forming a PN junction at a lower part of the first semiconductor layer, wherein a gate insulating layer stack containing a charge storage of each of the cell devices is formed on a part of the wall type semiconductor, and wherein a gate electrode of each of the cell devices is formed on the gate insulating layer stack in transverse direction of the wall type semiconductor.

Figure 1:
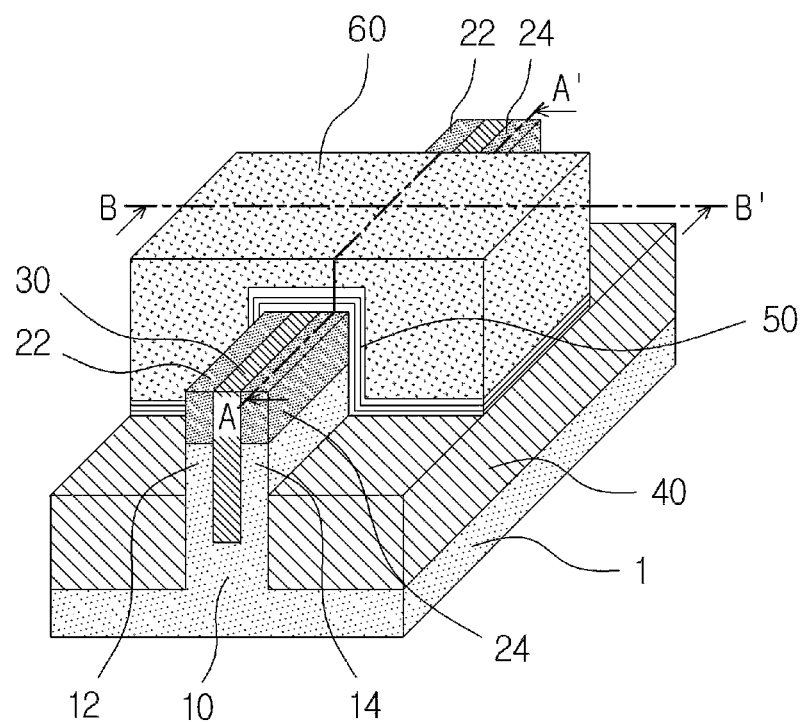
FIG. 1 is a perspective view showing a cell device structure of a nonvolatile memory cell string according to an embodiment of the present invention.
Figure 2:
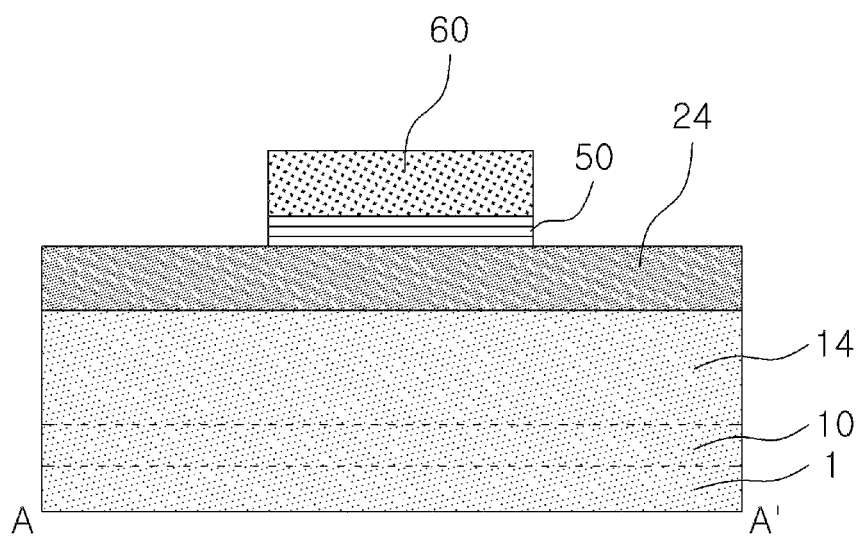
FIG. 2 is a cross sectional view taken along line A-A' in FIG. 1.

Here, the gated diode structure indicates, as shown in FIGS. 1 and 2, under a gate electrode 60, each cell device has one or more PN junctions formed between a first semiconductor layer 22 or 24 doped with a specific type (e.g., an N-type) impurity and a second semiconductor layer 12 or 14 doped with an opposite type (e.g., a P-type) impurity from the upper part of the wall type semiconductor 10. On the other hand, an isolation insulating layer 40 can be further formed around the wall type semiconductor 10, and a part of the wall type semiconductor 10 can be protruded from the isolation insulating layer 40.

Figure 3:
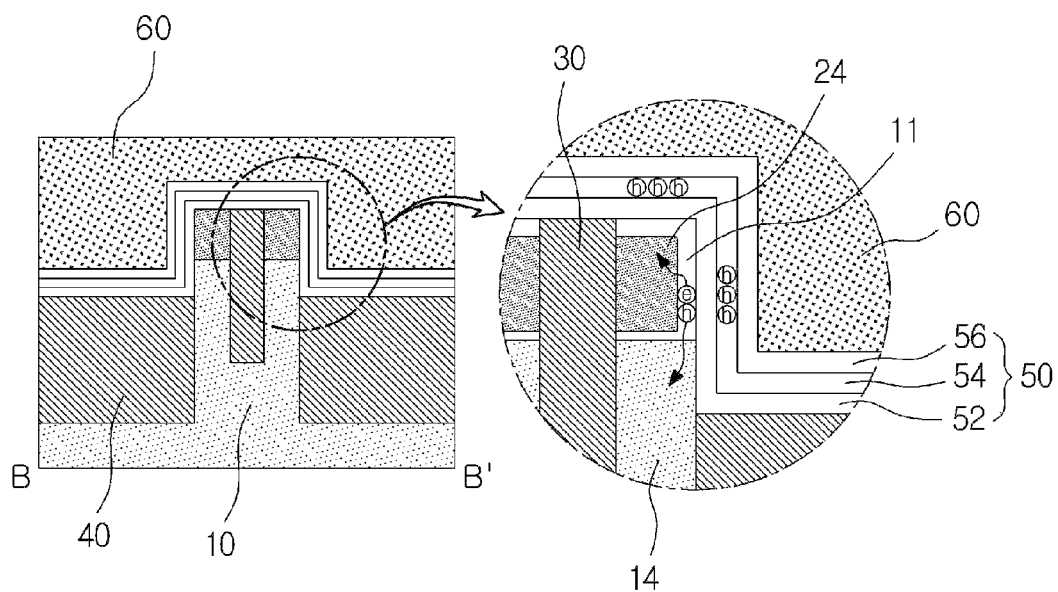
FIG. 3 is a cross sectional view taken along line B-B' in FIG. 1 and its partial enlarged view for explaining one of read operations.

Consequently, each cell device forming a nonvolatile memory cell string according to an embodiment of the present invention, as shown in FIGS. 1 to 3, in a detailed example, can be comprised of: a wall type semiconductor 10 protruded from semiconductor substrate 1 and formed of a PN junction between a first semiconductor layer 22 or 24 and a second semiconductor layer 12 or 14, an isolation insulating layer 40 filled into a predetermined height of the wall type semiconductor, a gate insulating layer stack 50 containing a charge storage layer formed on the isolation insulating layer 40 and at least on both sides of the wall type semiconductor 10, and a gate electrode 60 formed to wrap the gate insulating layer stack 50.

And the wall type semiconductor 10 can be formed to twin fins separated by a trench formed in a longitudinal direction that is vertical to the gate electrode 60 with a predetermined depth from an upper part and the twin fins can form two independent cell strings having the first 22 or 24 and second 12 or 14 semiconductor layers from the upper part respectively.

And a gate electrode 60 of each cell device, as shown in FIG. 3, is formed in transverse direction of a wall type semiconductor 10 to wrap the first semiconductor layers 22 and 24 interlaying a gate insulating layer stack 50 containing a charge storage layer 54 and preferably to cover a part of the second semiconductor layers 12 and 14 for containing a PN junction formed between the first semiconductor layer 22 or 24 and the second semiconductor layer 12 or 14.

By the above mentioned embodiment, it is possible to increase the degree of integration by separating a wall type semiconductor 10 into two twin fins 12, 22, 14 and 24 and also to perform a memory operation with low power using a gate induced drain leakage (GIDL).

In the conventional MOSFET type switch devices, a gate induced drain leakage (GIDL) is an OFF time current (namely, a leakage current in standby state) and is tried to reduce to minimum, but one of main technical ideas in the present invention is to reversely and positively use GIDL for performing a memory operation.

By using each cell device structure of embodiments shown in FIGS. 1 to 3, a nonvolatile memory cell string can be formed. If a plurality of the cell strings is used to embody a memory array as mentioned below, a circuit diagram can be drawn as shown in FIG. 11.

Figure 11:
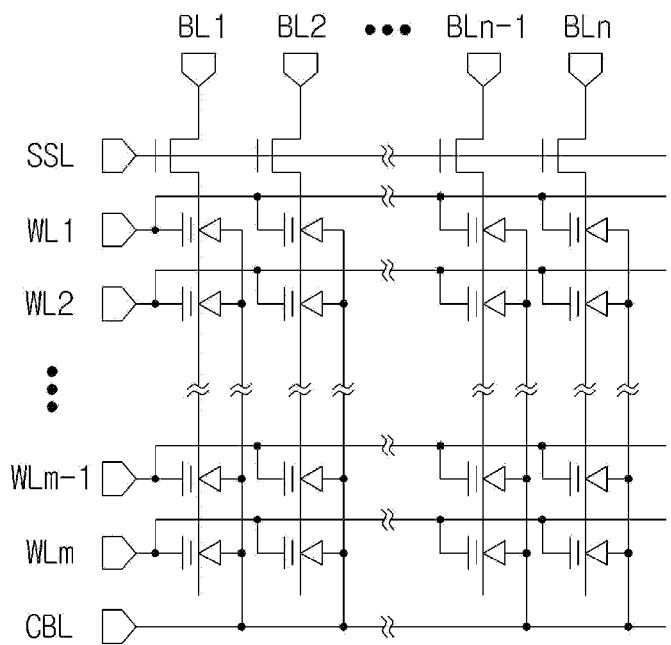
FIGS. 11 and 12 are circuit diagrams showing NAND flash memory arrays according to some embodiments of the present invention.

FIG. 11 shows a gated diode structure having a PN junction in each cell device by forming the first 22 or 24 and second 12 or 14 semiconductor layers doped with a high concentration of an N-type impurity as a source/drain region of the conventional MOSFET device and doped with a concentration of a P-type impurity as a body region of the conventional MOSFET device, respectively.

In each cell device of a specific cell string shown in FIG. 11, a second semiconductor layer 12 or 14 as a P-type semiconductor layer is connected through a common body line (CBL) to a second semiconductor layer of an adjacent cell device. A first semiconductor layer 22 or 24 as an N-type semiconductor layer is connected to a first semiconductor layer of an adjacent cell device at an upper part of each wall type semiconductor 10 and finally connected to each bit line (BL1, BL2 etc.) through a string selection transistor formed by string selection line (SSL) formed on one end of each wall type semiconductor 10. A gate electrode 60 of each cell device is connected to each word line (WL1, WL2 etc.). The common body line can be formed in a well to prevent an electrical connection with a body of the string selection transistor.

Figure 8:
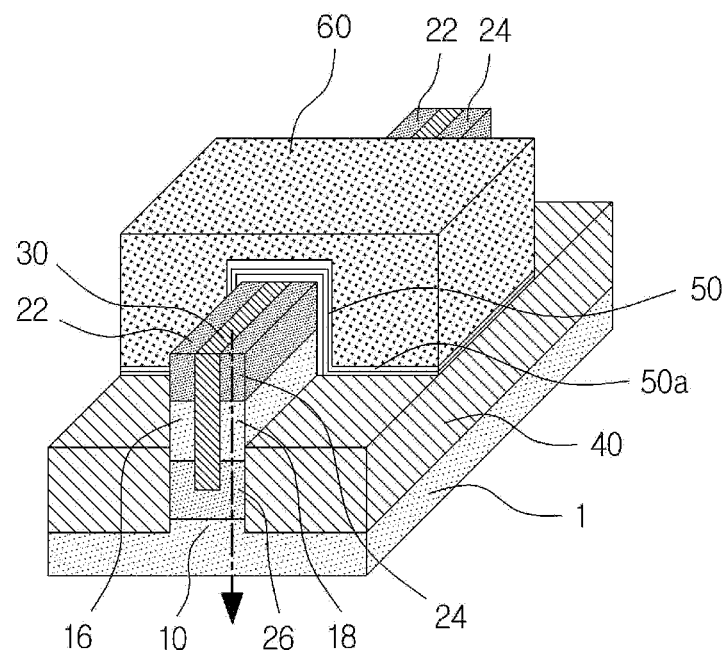
Figure 12:
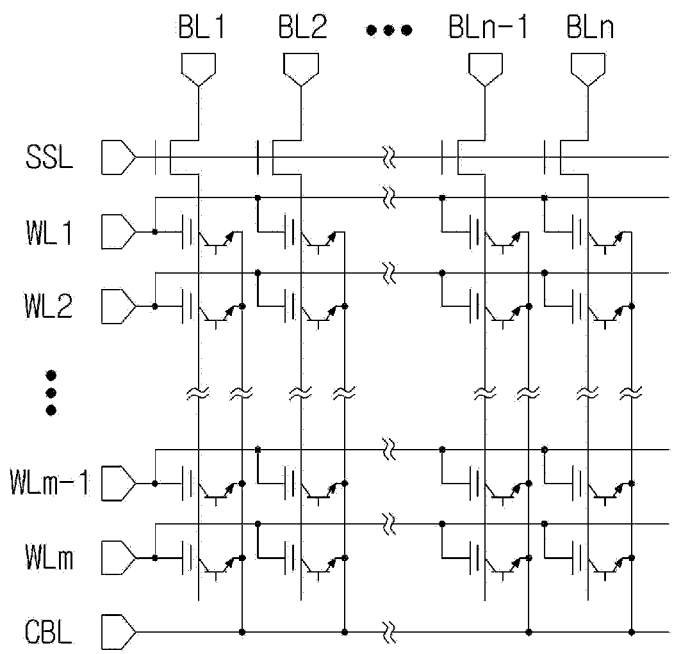

On the other hand, FIG. 12 shows a circuit diagram of an embodiment for a NAND flash memory array embodied by a plurality of nonvolatile memory cell strings formed with each cell device structure as shown in FIG. 8.

Each cell device shown in FIG. 8 shows the second semiconductor layers 16 and 18 can be formed as a floating body by further forming a third semiconductor layer 26 doped with an impurity which is the same as a first semiconductor layer 22 or 24 to form a PN junction with the second semiconductor layers 16 and 18 on lower part of the second semiconductor layers 16 and 18 of a wall type semiconductor 10 in embodiments shown in FIGS. 1 to 3.

FIG. 8 shows an example of the third semiconductor layer formed in a body of a wall type semiconductor. In this case, an NPN or PNP bipolar transistor floating a base between an upper part of a wall type body and a semiconductor substrate is formed and enabled to enlarge a GIDL current occurred from each cell. Case by case, an optional voltage can be applied to the second semiconductor layer formed in each cell string.

Of cause, in an embodiment shown in FIG. 8, the first semiconductor layers 22 and 24 can be embodied with a high doping concentration (N+ or P+) as a source/drain region of the conventional MOSFET device, the second semiconductor layers 16 and 18 can be embodied with a concentration (P or N) as a body region of the conventional MOSFET device or a semiconductor substrate 1, and the third semiconductor layer 26 can be embodied with a medium-sized concentration (N− or P−) which is the same or lower than the first semiconductor layers 22 and 24 but higher than the second semiconductor layers 16 and 18.

And the third semiconductor layer 26, though not shown in figures, can be embodied to be extended to the semiconductor substrate 1 for electrically connecting adjacent wall type semiconductors. It is possible to apply a voltage to the third semiconductor layer 26 connected commonly and to read the current flowing through this region.

FIG. 12 shows that each cell device of a cell string has a NPNP type gated diode structure with a plurality of PN junctions in an arrow direction shown in FIG. 8, from first semiconductor layers 22 and 24 of an upper part of a wall type semiconductor 10 to a semiconductor substrate 1. In this case, because each cell device is operated as a NPN bipolar transistor having a floated base (P-type second semiconductor layer region: 16 or 18), FIG. 12 is drawn in this condition.

As shown in FIG. 12, when each cell device of a cell string is operated as a NPN bipolar transistor having a floated base, as mentioned below, holes occurred from a depletion region 11 between a first semiconductor layer 22 or 24 as an N+ region and a gate electrode 60 are entering into and accumulating in a second semiconductor layer 16 or 18 of a P-type floated base. As a result, a potential barrier between first 22 or 24 and second 16 or 18 semiconductor layers is decreased, a current flowing from a first semiconductor layers 22 and 24 to a third semiconductor layer 26 is higher, and it is possible to obtain an amplified read current.

Operation methods of embodiments showed in FIGS. 1 to 3 and each cell device of a cell string showed in FIG. 8 are described with respect to FIGS. 11 and 12, respectively.

Program Operation

As like as the conventional method, in a program inhibition state of all cell strings except a target cell string, the program in the target cell string can be performed by the Fowler-Nordheim (FN) tunneling occurred by applying a voltage to a gate electrode connected to a target word line. For example, a voltage of a first semiconductor layer can be boosted in the unselected cell strings being in a program inhibition state, but the boostring can be removed in the target cell string. If the first semiconductor layer is an N-type, the second semiconductor layer is to be a P-type. When a positive voltage is applied to the gate electrode, electrons are mainly moved from the first semiconductor layer to the charge storage layer by tunneling.

Erase Operation

As like as the conventional method, erase can be optionally operated by the FN tunneling induced by applying a voltage to a gate electrode of a cell connected to the target word line. For example, if the first semiconductor layer is an N-type, the second semiconductor layer is to be a P-type. When a negative voltage is applied to the gate electrode, electrons stored in the charge storage layer are mainly moved to the first semiconductor layer by the FN tunneling or holes are stored in the charge storage layer by the FN tunneling. On the other hand, when a positive voltage is applied to a first semiconductor layer, a specific cell or all cell strings can be erased. This operating concept can be expanded to erase all arrays with a predetermined size at the same time.

Read Operation

In FIG. 3, it is assumed that the first semiconductor layers 22 and 24 are doped with N+ (it means the concentration of an N-type impurity is higher than that marked with an N) and the second semiconductor layers 12 and 14 are doped with a P-type impurity. If holes are injected into a charge storage layer 54 of a gate insulating layer stack 50, a band bending is became slack in a depletion region 11 at a lower part of a gate electrode 60, as an enlarged view shown in FIG. 3, and a size of GIDL current flowing between the first semiconductor layer 22 or 24 and the second semiconductor layers 12, 14, 16 or 18 is reduced.

Reversely, if electrons are stored in a charge storage layer 54 of a gate insulating layer stack 50, the GIDL current is increased.

As mentioned above, a read operation can be performed by using a difference of the GIDL current according to a programmed or erased state And the size of GIDL current is changed by the amount of holes or electrons stored in the charge storage layer. This difference is sufficiently sensed in a read operation too.

In the read operation, the GIDL is caused by an electron-hole generation according to a band bending in a depletion region 11 at a lower part of a gate electrode 60. Generated electrons flow into a bit line through a first semiconductor layer 22 or 24, and generated holes flow into a second semiconductor layer 12, 14, 16 or 18.

As shown in FIG. 11, when a specific cell is read in a cell string, a voltage is applied to a gate of the specific read cell for observing the GIDL and a current of a bit line is read by turning-on SSL. At this time, a voltage not generating GIDL or 0V can be applied to gate electrodes of all the pass cells except the specific read cell.

FIG. 8 shows a structure being able to amplify a current in the read operation. For explanation, it is assumed that a first 22 and 24, a second 16 and 18 and a third 26 semiconductor layers are doped with an N+-type, a P-type and an N-type impurities, respectively. As shown in FIG. 3, electron-hole pairs are generated in a depletion region 11 at the read operation according to an amount or a polarity (a positive or a negative) of charge stored in the charge storage layer. The generated electrons flow into a bit line applied by a positive voltage along a first semiconductor layer 22 and 24. The generated holes are basically moved to and accumulated in the floated second semiconductor layers 16 and 18 and, in this case, an electric potential barrier between the second semiconductor layer 16 or 18 and the third semiconductor layer 26 is reduced to enable electrons to be injected from the third semiconductor layer 26. The third semiconductor layer 26 can be a kind of an N well and can be applied any voltage, but a preferable voltage is 0V. Electrons injected from the third semiconductor layer 26 pass through the second semiconductor layer 16 or 18, arrive at the first semiconductor layer 22 or 24 and then flow into a bit line. By the above mentioned method, under a bias condition originally generating GIDL, electrons injected from the third semiconductor layer 26 are additionally added to electrons generated in a depletion region 11 at a lower part of a gate electrode 60 and enable a read current to be amplified at a read operation. Thus, a device formed vertically along the arrow shown in FIG. 8 is operated as a NPN or PNP bipolar transistor with a floated base 16 or 18.

When the operating principle is considered, a gate electrode 60 of cell device is preferably formed to under a PN junction between the first semiconductor layer 22 or 24 and the second semiconductor layer 12, 14, 16 or 18 for wrapping the first semiconductor layers 22 and 24. This structure enables holes generated from the tunneling insulating layer 52 and an adjacent region in a depletion region 11 shown in FIG. 3 to effectively flow into the second semiconductor layer 12, 14, 16 or 18.

Because a cell device can be operated as mentioned above, when a cell string is formed to comprise a wall type semiconductor 10 formed by extending to have a predetermined length in one direction on a semiconductor substrate and two and more cell devices formed in series along a longitudinal direction on the wall type semiconductor 10 with structures according to embodiments as mentioned above, it is possible to operate as a nonvolatile memory cell string though one end of the cell string is electrically connected to outside through string selection transistors (transistors by SSL) formed on one end of the wall type semiconductor 10 and the other end of the cell string is not electrically connected to outside.

Thus, both ends of the conventional nonvolatile memory cell string are needed to have each selection transistor, respectively. But, as mentioned above, only one end is needed to have a selection transistor according to the present invention, so an area of cell string can be more reduced than that of the conventional one.

The above mentioned embodiment can be used as a base for applying various shapes, below the detailed examples are briefly described with reference to accompanying drawings.

Figure 4:
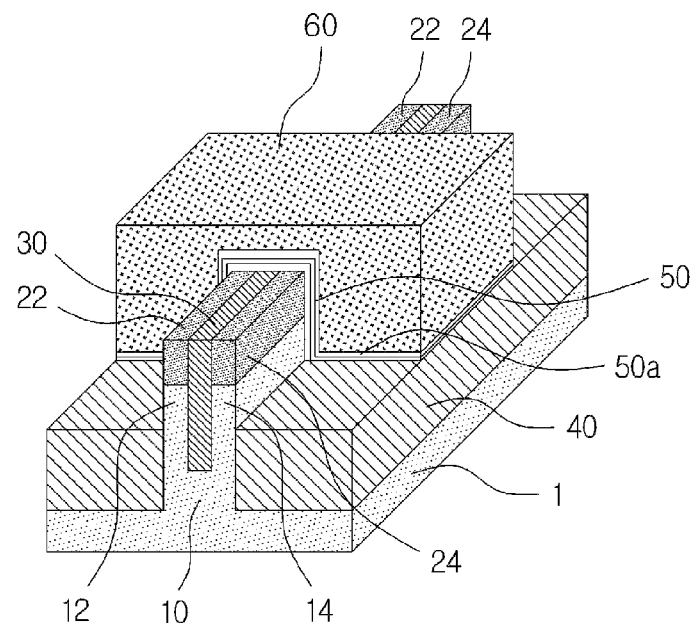
FIGS. 4 to 9 are perspective views showing some cell device structures of nonvolatile memory cell strings according to some embodiments of the present invention.

First, as shown in FIG. 4, the gate insulating layer stack 50 can be formed on side walls and an upper part of the wall type semiconductor. On the isolation insulating layer 40 the charge storage layer 54 and a blocking insulation layer 56 can be sequentially stacked as a gate insulating layer stack 50a.

Figure 5:
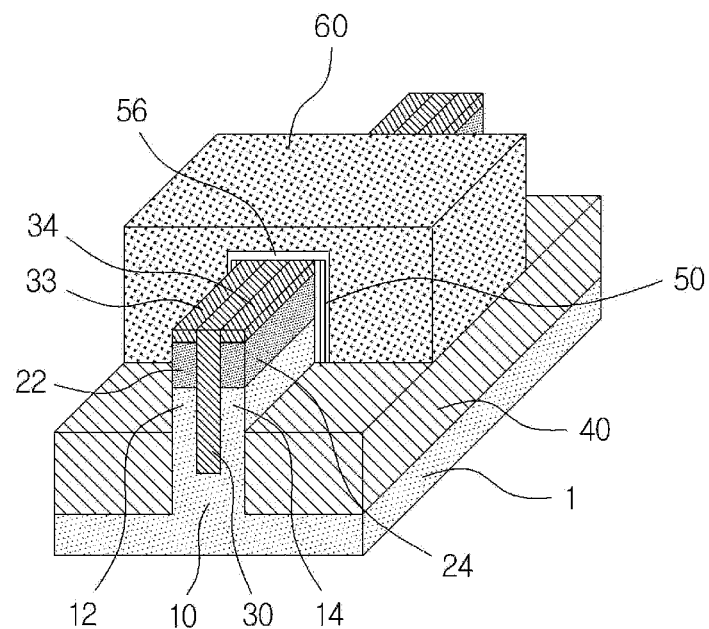

FIG. 5 shows that the gate insulating layer stack 50 can be formed only on side walls of the wall type semiconductor, but not on the isolation insulating layer 40. In this case, the upper parts of the first semiconductor layers 22 and 24 are preferably formed with a relatively thick insulating layers 33 and 34 respectively to remove any problems occurred at program or erase operations.

Figure 6:
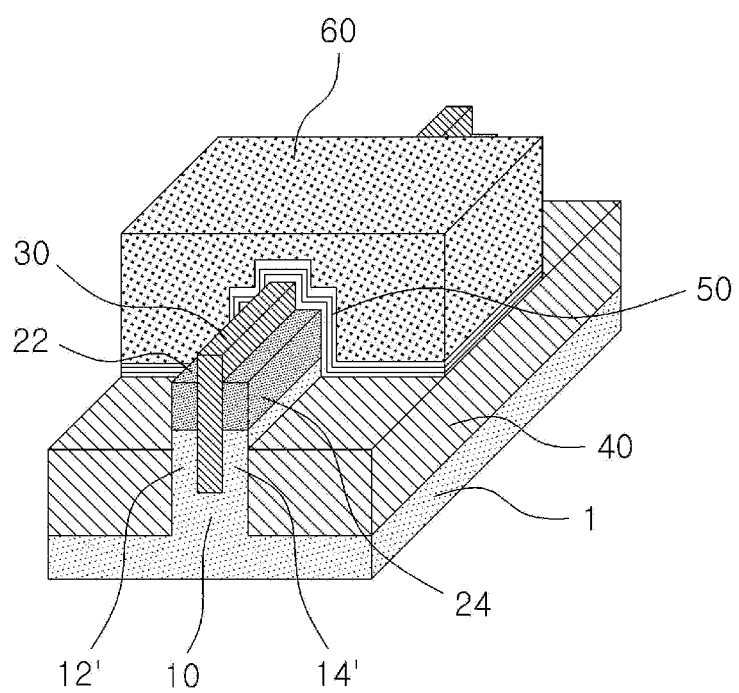
Figure 7:
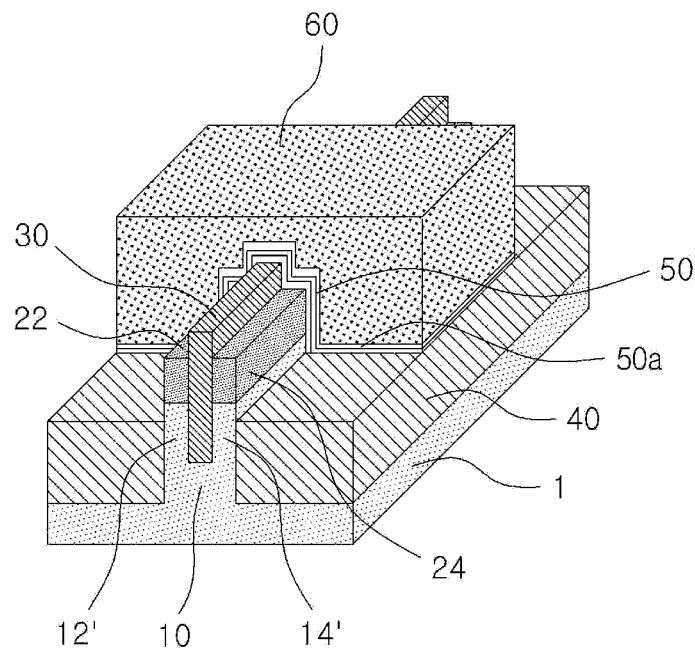

FIGS. 6 and 7 are basically similar to FIGS. 1 and 4, respectively. However, a separation insulating layer 30 formed between the twin fins is protruded more than the twin fins 12', 22, 14' and 24, but not in other embodiments.

By the above embodiment, a route of a gate insulating layer stack 50 wrapping the twin fins 12', 22, 14' and 24 and a separation insulating layer 30 can be increased to inhibit the movement of charges from a charge storage layer of any one fin to a charge storage layer of an adjacent other fin interlaying a separation insulating layer 30.

Figure 9:
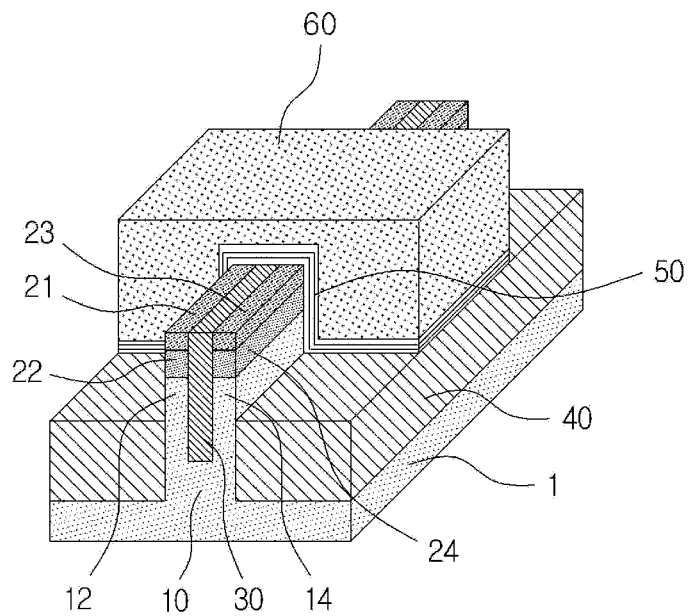

And FIG. 9 shows, in the above mentioned embodiments, upper parts of the first semiconductor layers 22 and 24 can be doped with an impurity which is the same type as the first semiconductor layers 22 and 24, respectively. And fourth semiconductor layers 21 and 23 having a lower energy bandgap than the first semiconductor layers 22 and 24 are further formed on each of the upper parts of the first semiconductor layers 22 and 24.

When an optimal bias is applied to generate a GIDL current, a current of read operation can be increased because of more generation of electron-hole pairs by band-to-band tunneling in a relatively small bandgap region.

On the other hand, though not shown in drawings, instead of the separation insulating layer 30, insulating layers are formed on the surface of the trench separating the twin fins and a shielding electrode is filled between the insulating layers in each embodiment.

At this time, the shielding electrode can be formed of semiconductor materials (e.g., a poly silicon, amorphous silicon etc.) doped with an impurity which is the same type (e.g., a P-type) as the wall type semiconductor 10 formed in one body with the semiconductor substrate or conductive materials (e.g., metal etc.). By this embodiment, the interference of adjacent cells can be basically prevented.

The shielding electrode can be applied with an optional voltage. For example, it is assumed that the first semiconductor layer is an N+ region, when the shielding electrode electrically insulated to any region of a wall type body is applied with a positive voltage, a resistance can be reduced because electrons are accumulated in the N+ doped first semiconductor layer.

In this case, a problem of an electric connection between the first semiconductor layers formed on an upper part of each twin fins can be occurred by an inversion layer induced in a second semiconductor layer.

It is assumed that a shielding electrode acts as a gate electrode, the first semiconductor layers formed on upper parts of twin fins act as source/drain regions and the second semiconductor layers act as channel regions. When the shielding electrode is applied with a positive voltage as the mentioned above, channels are formed by inversion layers in the second semiconductor layers and then a problem of electrical connection between the first semiconductor layers on both ends of twin fins can be occurred.

To prevent the electrical connection problem, it is preferred that a P-type impurity doping concentration is relatively higher on the surface of the second semiconductor layers which is contacted with the insulating layer under the shielding electrode than the other regions of the second semiconductor layers because the region doped with higher doping concentration makes it more difficult to form the inversion layer.

When a negative voltage is applied to the shielding electrode, holes are accumulated in the second semiconductor layers and then the first semiconductor layers of the twin fins are electrically isolated. At the same time, the resistance in the first semiconductor layers is increased.

Next, the shielding electrode can be electrically connected to a wall type semiconductor 10 formed in one body with semiconductor substrate. By this structure, a body contact for memory cell operation can be formed on the shielding electrode.

And the charge storage layer 54 can be formed of one selected from a nitride, metal oxide, nano-particle and conductive material. The first semiconductor layer 22 or 24 can be formed to have a structure rounded at a corner region contacted to an upper part and a side of the first semiconductor layer. It is preferred that the gate insulating layer stack 50 is formed to wrap the rounded first semiconductor layers 22 and 24.

Each cell device explained as each embodiment of the nonvolatile memory cell string can be modeling as one of synapses in a neuromophic technology and as the results, the memory cell string explained as each embodiment can be applied to one of components to embody a synapse array.

Embodiment for Memory Array

Next, detailed descriptions of embodiments of a memory array using the nonvolatile memory cell string are provided below with respect to FIGS. 11 to 16. In the below descriptions, a NAND flash memory array as a memory array using the nonvolatile memory cell string is mainly explained, but the NAND flash memory array described here can be used to apply a synapse array for a detailed neuromophic technology.

FIGS. 11 and 12 are circuit diagrams of memory arrays composed of cell strings according to the embodiments.

Figure 13:
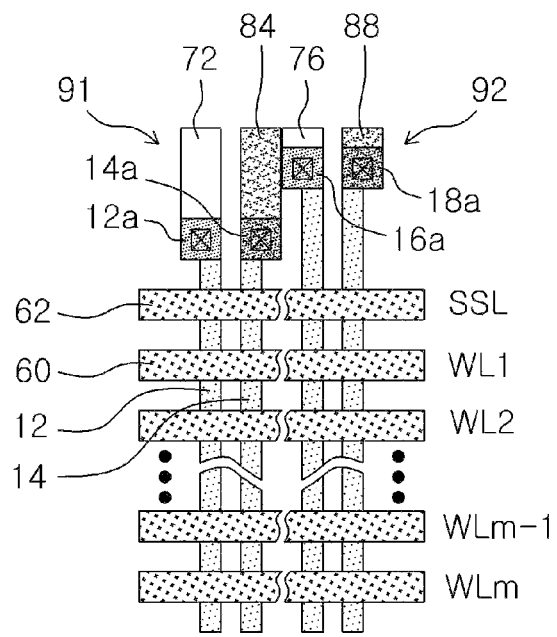
FIGS. 13 and 14 are layouts showing NAND flash memory array structures embodied by embodiments of the present invention according to FIGS. 11 and 12, respectively.
Figure 14:
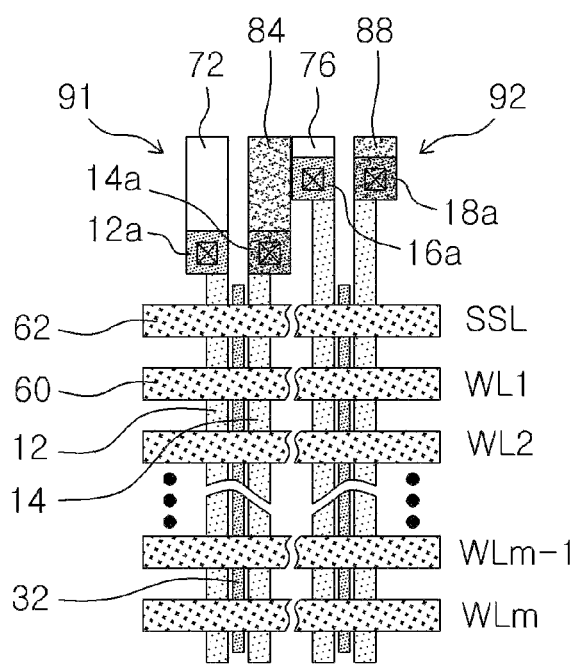
Figure 15:
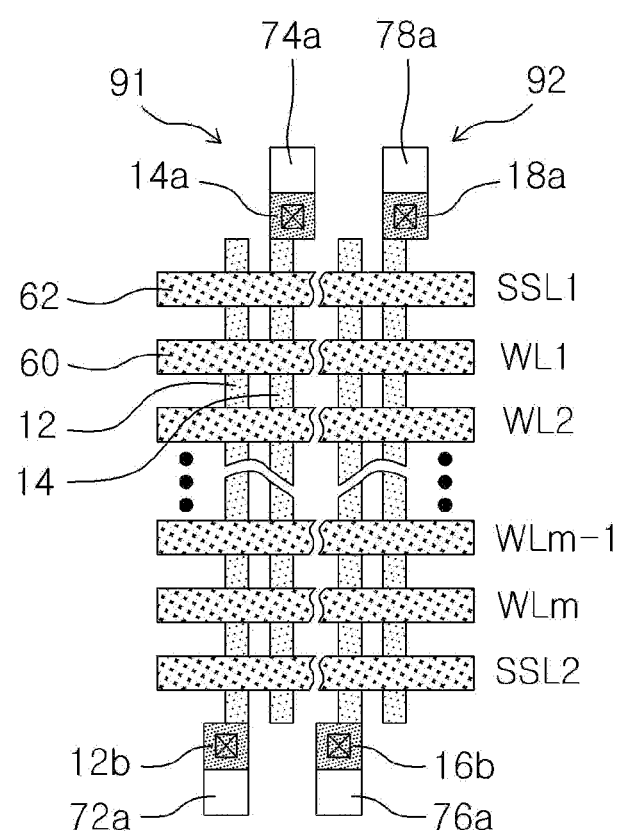
FIGS. 15 and 16 are layouts showing NAND flash memory array structures embodied by other embodiments of the present invention according to modification of FIGS. 13 and 14, respectively.
Figure 16:
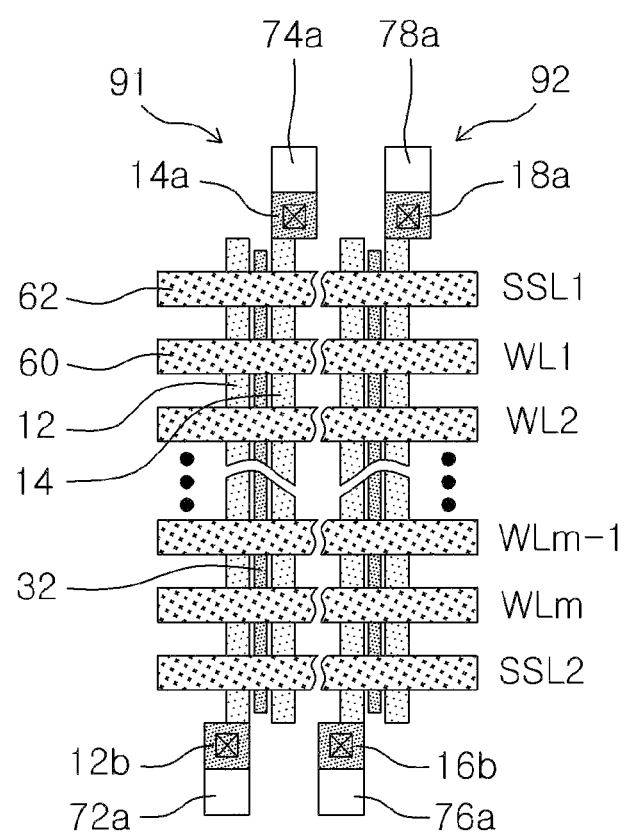

FIGS. 13 and 14 are layouts showing NAND flash memory array structures embodied by embodiments of the present invention according to FIGS. 11 and 12, respectively. FIGS. 15 and 16 are layouts showing NAND flash memory array structures embodied by other embodiments of the present invention according to modification of FIGS. 13 and 14, respectively.

A NAND flash memory array according to the present embodiment basically comprising: a plurality of cell strings formed to have a predetermined length along one direction on a semiconductor substrate 1; a plurality of word lines 60 (for example, WL1, WL2, . . . , WLm−1, WLm) formed to intersect each of the cell strings; a plurality of bit lines 72, 72a, 74a, 76, 76a, 78a, 84 and 88 (for example, BL1, BL2, . . . , BLn−1, BLn) electrically connected to one end of each of the cell strings; and one or more string selection line 62 (SSL) to select each of the cell strings.

Here, the cell strings, as shown in FIGS. 1, 13 to 16, can be formed on a plurality of wall type semiconductors 10, 91 and 92 protruded from the semiconductor substrate 1 and each wall type semiconductor can be formed with twin fins 12 and 14 separated by a trench formed in a longitudinal direction of the wall type semiconductor with a predetermined depth from an upper part. As a result, each of the cell strings can be formed along each of the twin fins 12 and 14.

As shown in FIGS. 14 and 16, shielding lines 32 can be further formed between the twin fins 12 and 14 interlaying an insulating layer for forming a shielding electrode in each cell device. At this time, the shielding lines 32 can be electrically connected to the semiconductor substrate 1.

And each twin fin 12 or 14 has a structure described in each embodiment related to the cell string. Namely, a first semiconductor layer is formed by doping with a specific type of impurity on an upper part of each twin fin 12 or 14 and a second semiconductor layer is formed by doping with a type of impurity opposite to the first semiconductor layer for forming a PN junction at a lower part of the first semiconductor layer.

Each cell device forming each cell string along each twin fin 12 or 14 is formed on the first and second semiconductor layers.

The string selection line 62 can be formed, as shown in FIGS. 11 to 14, with a single line (SSL) crossing the wall type semiconductor 10, 91 and 92 by one side of the plurality of word lines 60 (WL1, WL2, . . . , WLm−1, WLm) or formed, as shown in FIGS. 15 and 16, with two lines (SSL1, SSL2) by both sides of the plurality of word lines 60 (WL1, WL2, . . . , WLm−1, WLm).

Each of the plurality of bit lines 72, 72a, 74a, 76, 76a, 78a, 84 and 88 (BL1, BL2, . . . , BLn−1, BLn) is electrically connected to one end of each cell string 12 or 14 exposed to one side of the string selection line 60 and the other end of each cell string 12 or 14 is not electrically connected to outside.

In other words, when the string selection line 62, as shown in FIGS. 11 to 14, can be formed with a single line (SSL) by one side of the plurality of word lines 60 (WL1, WL2, . . . , WLm−1, WLm), each bit line 72, 76, 84 or 88 can be connected by a contact pad 12a, 14a, 16a or 18a to one end of each cell string 12 or 14 exposed to one side of the string selection line SSL. And the other end of each cell string 12 or 14 which is not connected to each bit line is not electrically connected to outside.

On the other hand, when the string selection line 62, as shown in FIGS. 15 and 16, is formed with two lines (SSL1, SSL2) by both sides of the plurality of word lines 60 (WL1, WL2, . . . , WLm−1, WLm), each bit line 72a, 74a, 76a or 78a can be connected by a contact pad 12b, 14a, 16b or 18a to one end of each cell string 12 or 14 exposed to one side of the string selection lines (SSL1 and SSL2) by alternating with each string selection line (SSL1 or SL2).

In the former embodiment, as shown in FIGS. 11 to 14, when each bit line 72, 76, 84 or 88 is connected to one end of each cell string 12 or 14 through a single string selection line (SSL) from one side of a plurality of word lines, the bit lines 72, 76, 84 and 88 can be formed on different layers to avoid leakage currents between adjacent bit lines. For example, bit lines 72 and 76 can be formed on a down layer; bit lines 84 and 88 can be formed on an upper layer.

A string selection transistor connected to one end of the cell string is embodied at least one and more. If a cell array is simple, a single string selection transistor can be connected and operated. But if the cell array is complex, one and more string selection transistors can be connected in series.

Figure 10:
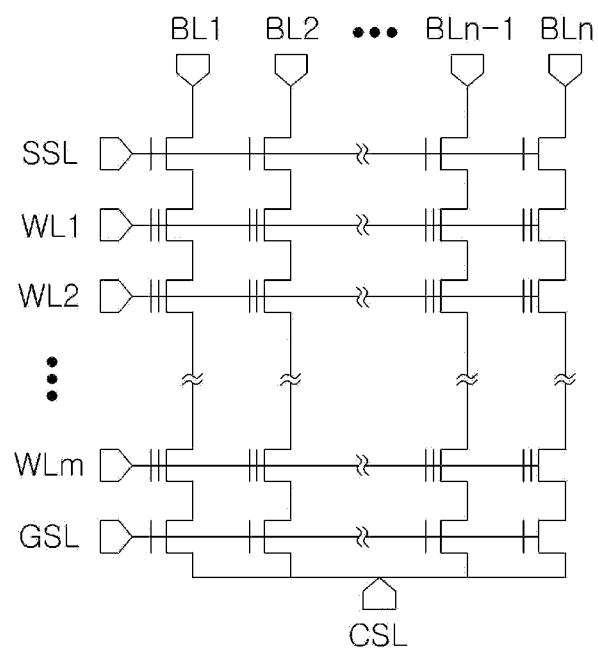
FIG. 10 is a circuit diagram showing a conventional NAND flash memory array.

By the above mentioned composition, GSL and CSL required necessarily in the conventional NAND flash memory array shown in FIG. 10 can be removed and reduce area consumption to increase the degree of integration.

What is claimed is:

1. A nonvolatile memory cell string comprising:
    two or more cell devices formed in series on a wall type semiconductor protruded from a semiconductor substrate with a predetermined length along one direction to form the cell string,
    wherein one end of the cell string is electrically connected to outside through one or more string selection transistors formed on one end of the wall type semiconductor,
    wherein each of the cell devices is formed on a first semiconductor layer doped with a specific type of impurity on an upper part of the wall type semiconductor and a second semiconductor layer doped with a type of impurity opposite to the first semiconductor layer for forming a PN junction at a lower part of the first semiconductor layer,
    wherein a gate insulating layer stack covering the PN junction is formed on a part of the wall type semiconductor, the gate insulating layer stack containing a charge storage of each of the cell devices; and
    wherein a gate electrode of each of the cell devices is formed on the gate insulating layer stack in transverse direction of the wall type semiconductor, the gate electrode covering the PN junction.

2. The nonvolatile memory cell string of claim 1, wherein a body of the string selection transistors is electrically isolated from the second semiconductor layer.

3. The nonvolatile memory cell string of claim 1,
    wherein the wall type semiconductor is formed with twin fins separated by a trench formed in a longitudinal direction with a predetermined depth from an upper part, and
    wherein the twin fins form two independent cell strings having the first and second semiconductor layers from the upper part respectively.

4. The nonvolatile memory cell string of claim 3,
wherein the twin fins are separated by a separation insulating layer filled up inside the trench, and
wherein the separation insulating layer is formed to protrude more than the twin fins.

5. The nonvolatile memory cell string of claim 3, wherein insulating layers are formed on side walls of the trench separating the twin fins and a shielding electrode is filled between the insulating layers.

6. The nonvolatile memory cell string of claim 5, wherein the shielding electrode is electrically connected to the wall type semiconductor formed in one body with the semiconductor substrate.

7. The nonvolatile memory cell string of claim 6, wherein the shielding electrode is formed of a semiconductor material doped with the same type impurity as the second semiconductor layer or a conductive material.

8. The nonvolatile memory cell string of claim 3, wherein the impurity doping concentration of the bottom of the trench of the second semiconductor layer between the twin fins is higher than that of other regions of the second semiconductor layer.

9. The nonvolatile memory cell string of claim 1, wherein an isolation insulating layer is further formed to cover a part of the wall type semiconductor and the semiconductor substrate under the gate insulating layer stack.

10. The nonvolatile memory cell string of claim 1, wherein the first semiconductor layer is rounded at a corner region of upper and side parts.

11. The nonvolatile memory cell string of claim 1, wherein the gate insulating layer stack is only formed on the side wall of the wall type semiconductor.

12. The nonvolatile memory cell string of claim 1, wherein the gate insulating layer stack is formed by sequentially stacking the charge storage layer/a blocking insulating layer, a tunneling insulating layer/the charge storage layer/a blocking insulating layer, or a first tunneling insulating layer/a first charge storage layer/a second tunneling insulating layer/a second charge storage layer/a blocking insulating layer.

13. The nonvolatile memory cell string of claim 1, wherein the wall type semiconductor is further comprising a third semiconductor layer doped with the same type impurity as the first semiconductor layer for forming a PN junction with the second semiconductor layer at a lower part of the second semiconductor layer.

14. The nonvolatile memory cell string of claim 13, wherein the third semiconductor layer is extended to the semiconductor substrate and electrically connected to adjacent wall semiconductors.

15. The nonvolatile memory cell string of claim 1,
wherein a fourth semiconductor layer is further formed on the upper part of first semiconductor layer, and
wherein the fourth semiconductor layer is doped with the same type impurity as the first semiconductor layer and has an energy bandgap smaller than that of the first semiconductor layer.

16. A NAND flash memory array comprising:
a plurality of cell strings formed to have a predetermined length along one direction on a semiconductor substrate;
a plurality of word lines formed to intersect each of the cell strings;
a plurality of bit lines electrically connected to one end of each of the cell strings; and
one or more string selection lines to select each of the cell strings,
wherein each of the cell strings is formed on a wall type semiconductor protruded from the semiconductor substrate,
wherein the string selection line is formed to intersect the wall type semiconductor at least by one side of the plurality of word lines,
wherein each of the bit lines is electrically connected to one end of each of the cell strings exposed to one side of the string selection line,
wherein the other end of each of the cell strings is not electrically connected to outside, and
wherein each of cell devices forming each of the cell strings is formed on a first semiconductor layer doped with a specific type of impurity on an upper part of the wall type semiconductor and a second semiconductor layer doped with a type of impurity opposite to the first semiconductor layer for forming a PN junction at a lower part of the first semiconductor layer.

17. The NAND flash memory array of claim 16,
wherein the wall type semiconductor is protruded with a predetermined interval on the semiconductor substrate and formed with twin fins separated by a trench formed in a longitudinal direction with a predetermined depth from an upper part, and
wherein a shielding line is further formed between insulating layers formed on side walls of the trench for forming a shielding electrode in each of the cell devices.

18. The NAND flash memory array of claim 17, wherein the shielding line is electrically connected to the semiconductor substrate or applies a specific voltage independently from the semiconductor substrate.

19. The NAND flash memory array of claim 16, wherein the string selection line is formed into one or more lines by one side of the plurality of word lines.

20. The NAND flash memory array of claim 16,
wherein the string selection line is formed into two lines in both sides of the plurality of word lines, and
wherein each of the bit lines is connected to one end of each of the cell strings exposed to one side of each string selection line by alternating with the each string selection line.

21. The NAND flash memory array of claim 1, wherein the other end of the cell string is not electrically connected to outside.

* * * * *